United States Patent [19]

Park

[11] Patent Number: 5,421,914
[45] Date of Patent: Jun. 6, 1995

[54] SURFACE MODIFICATION OF HIGH TEMPERATURE IRON ALLOYS

[75] Inventor: Jong-Hee Park, Clarendon Hills, Ill.

[73] Assignee: The University of Chicago, Chicago, Ill.

[21] Appl. No.: 135,295

[22] Filed: Oct. 12, 1993

[51] Int. Cl.$^6$ .............................................. C23C 8/06
[52] U.S. Cl. ................................... 148/279; 148/217; 148/222; 148/230; 148/286; 148/287; 427/528; 427/574; 427/578; 428/472.2
[58] Field of Search ............... 148/279, 286, 287, 217, 148/222, 230, 318; 427/528, 574, 578, 588; 428/472.2

[56] References Cited

U.S. PATENT DOCUMENTS

| | | | |
|---|---|---|---|
| 4,531,984 | 7/1985 | Madsac et al. | 148/230 |
| 4,929,287 | 5/1990 | Hirbod | 148/286 |
| 4,938,993 | 7/1990 | Bennett | 427/574 |

OTHER PUBLICATIONS

"Surface Modification of High Temperature Alloys: A Protective and Adhesive Scale-Forming Process," J. H. Park, Abstract and Drawings, Oct. 11, 1992.
"Oxidation Behavior of Iron–Chromium Alloys at Elevated Temperatures: A Reactive-element Effect," Park, et al., Fossil Energy Program, AN/FE-92/1, Mar. 1992.
"Role of Yitrium in Enhanced Adhesion of Chromia Scale to Chromium," Park, Materials Letters, vol. 8, No. 10, Oct. 1989.
"Electronic Transport in Thermally Grown $Cr_2O_3$," Park, et al., Reprinted from Oxidation of Metals, vol. 33, Nos. 1/2, 1990, pp. 31–54, (received Apr. 5, 1989, revised Jun. 26, 1989).
"Transport Properties of Thermally Grown $Cr_2O_3$," Park et al., Fossil Energy Program, AN/FE-89/5, May 1989.
"Sulfur and Oxygen Tranport Properties of Thermally Grown $Cr_2O_3$ Films," Park, et al., High Temperature Science, vol. 30, 1991, pp. 193–219.
"Effect of Y on Cation and Anion Grain Boundary Diffusion in Chromia," King, et al., Colloque de Physique, Colloque C1, supplement au n°1, Tome 51, Janvier 1990, C1-551-556.
"Cation Tracer Diffusion in $Cr_2O_3$ and $Cr_2O_3$–0.09 wt % $Y_2O_3$," Park, et al., Journal of the American Ceramic Society, vol. 70, No. 12, Dec. 1987.
"Role of Alloying Additions in the Oxidation-Sulfidation of Fe–Base Alloys," Natesan, et al., reprinted from Corrosion & Particle Erosion at High Temperatures, Proceedings of a Symposium held at the 118th annual meeting of The Minerals, Metals & Materials Society, Feb. 27–Mar. 3, 1989, pp. 49–64.

Primary Examiner—Upendra Roy
Assistant Examiner—Robert R. Koehler
Attorney, Agent, or Firm—Reinhart, Boerner, Van Deuren, Norris & Rieselbach

[57] ABSTRACT

A method and article of manufacture of a coated iron based alloy. The method includes providing an iron based alloy substrate, depositing a silicon containing layer on the alloy surface while maintaining the alloy at a temperature of about 700° C.–1200° C. to diffuse silicon into the alloy surface and exposing the alloy surface to an ammonia atmosphere to form a silicon/oxygen/nitrogen containing protective layer on the iron based alloy.

17 Claims, 6 Drawing Sheets

SURFACE MODIFICATION OF HIGH TEMPERATURE IRON ALLOYS

The United States Government has rights in this invention pursuant to Contract No. W-31-109-ENG-38 between the U.S. Department of Energy and the University of Chicago.

The invention is concerned generally with a method of modifying a surface region of high temperature iron alloys, such as Fe—Cr alloys. More particularly, the invention is directed to a method of protection against corrosive atmospheres by modifying the surface of an Fe—Cr alloy by forming a silicide based coating on the Fe—Cr surface.

Protection against corrosion of structural iron based alloys is of fundamental importance in high temperature materials applications. Typically, corrosion protection is obtained by formation of a chromium oxide scale which acts as a diffusion barrier between the corrosive environment and the iron based alloy. Unfortunately, conventional protective coatings are subject to erosion and spallation under high temperature corrosive atmospheric use. Such iron based alloys have been the subject of substantial unsuccessful research to determine compositions resistant to formation of such unstable coatings.

It is therefore an object of the invention to provide an improved article and method of manufacture of iron based alloys.

It is another object of the invention to provide a novel article and method of manufacture of a protective coating on iron based alloys.

It is a further object of the invention to provide an improved article and method of manufacture of a protective silicide based coating on iron-chromium alloys.

It is still another object of the invention to provide a novel article and method of manufacture of a protective amorphous silicon containing coating on an iron based alloy.

It is yet a further object of the invention to provide an improved article and method of manufacture of a protective silicon (nitrogen and/or chromium) compound coating on an iron based alloy.

It is also an object of the invention to provide a novel article and method of manufacture of an iron-chromium alloy doped with cerium, yttrium or lanthanum with the surface coated with a silicide layer diffused into the alloy surface.

It is an additional object of the invention to provide an improved article and method of manufacture of a silicon containing (or silicide), corrosion protection coating which passivates line and point defects near the surface of an iron based alloy.

Other objects, features and advantages of the present invention will be readily apparent from the following description of the preferred embodiments thereof, taken in conjunction with the accompanying drawings described below wherein like elements have like numerals throughout the several views.

DETAILED DESCRIPTION OF PREFERRED EMBODIMENTS

Figure 1:
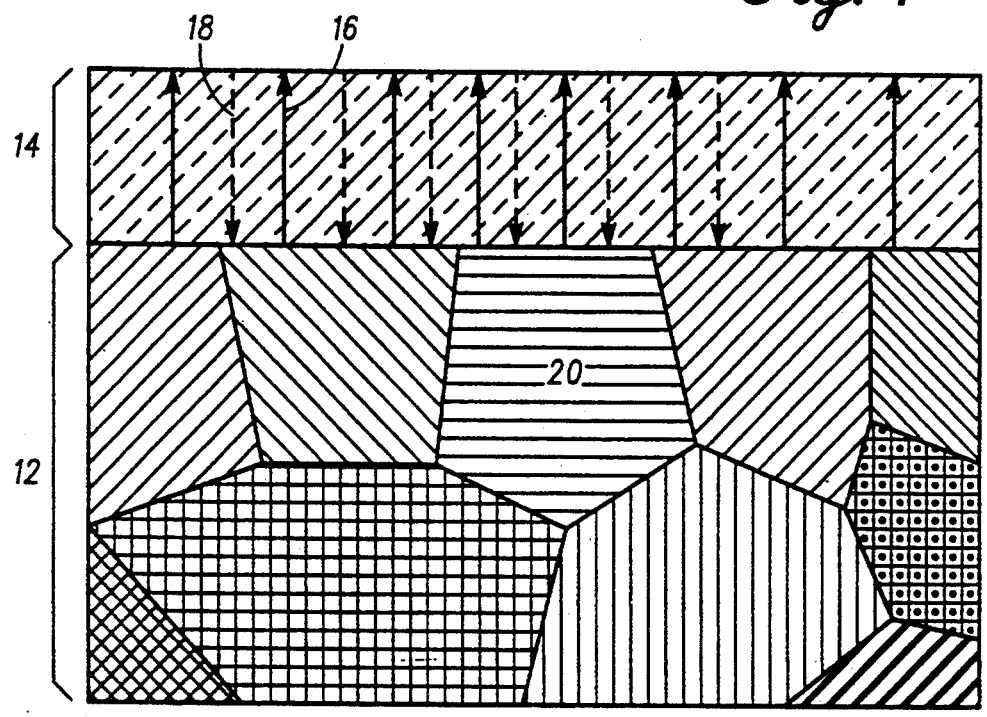
FIG. 1 illustrate a schematic of a microstructural cross section near the surface of an iron based alloy undergoing ion diffusion.
Figure 2:
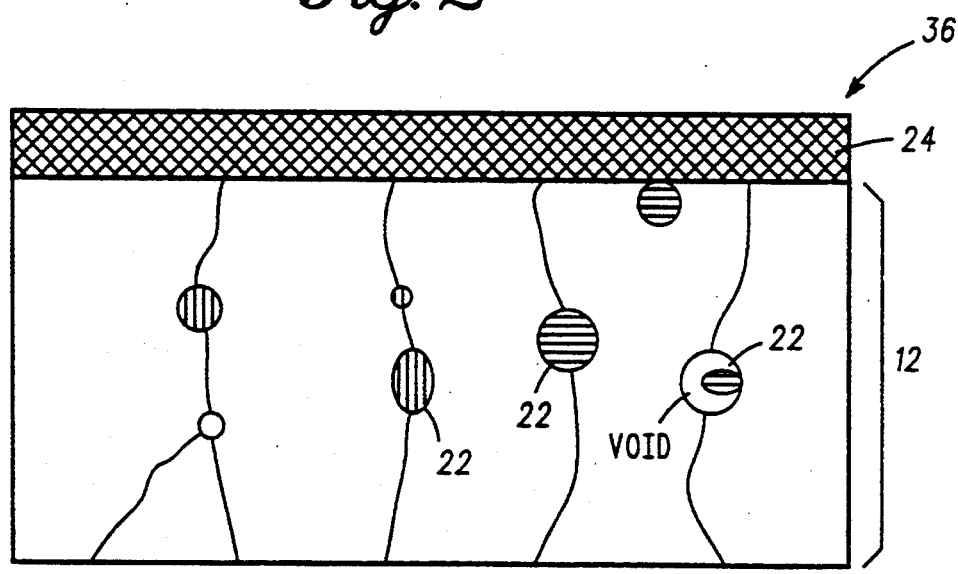
FIG. 2 illustrates another schematic of a microstructural cross section near the surface of an iron based alloy with grain boundary phases containing yttria.
Figure 3:
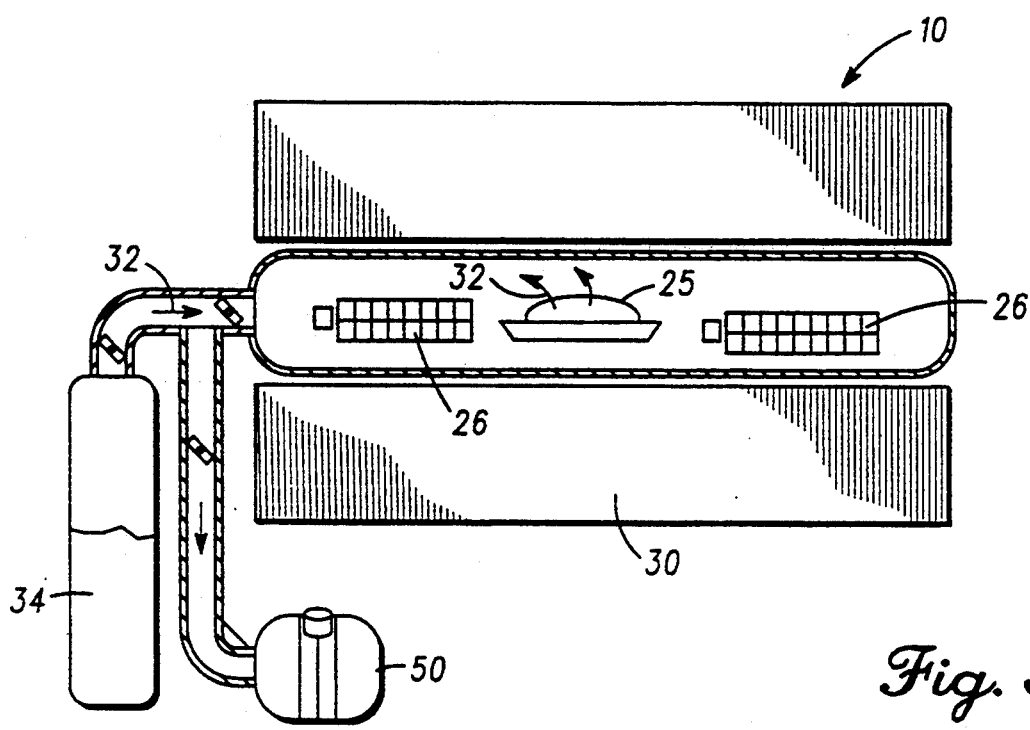
FIG. 3 illustrates a chemical vapor deposition apparatus used to apply silicon based coatings to the surface of iron based alloys.
Figure 4A:
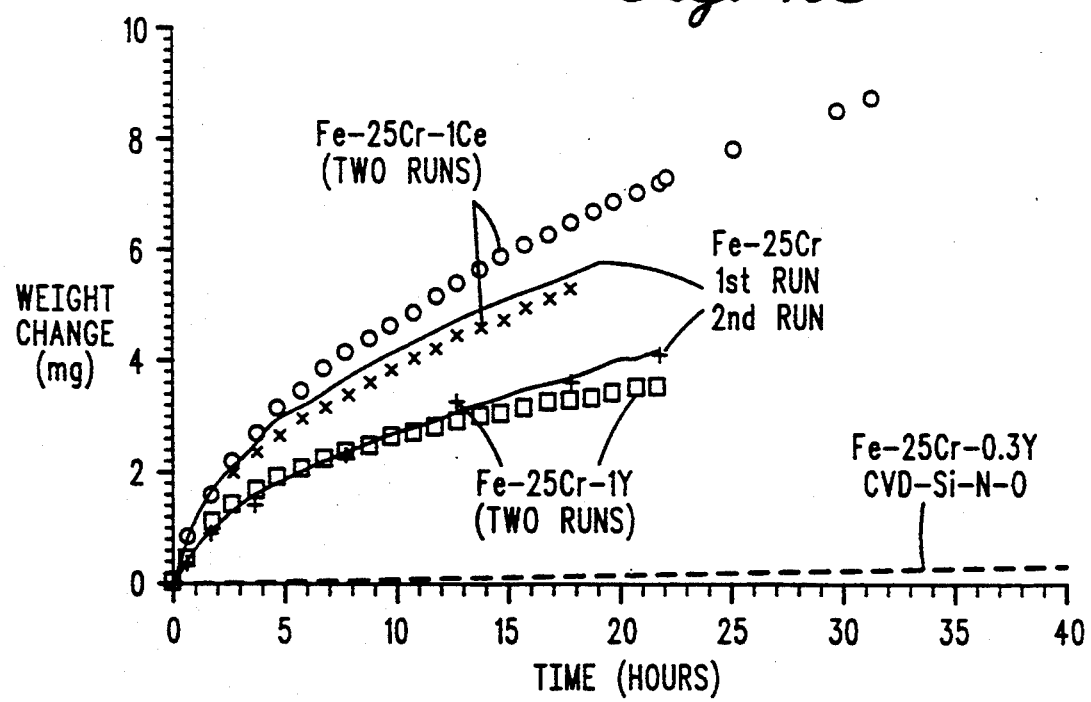
FIG. 4A illustrates the weight change arising from corrosion for selected iron based alloys oxidized in a $pO_2$ atmosphere of $10^{-4}$ atm, at 1000° C. over a 0–40 hour time period.
Figure 4B:
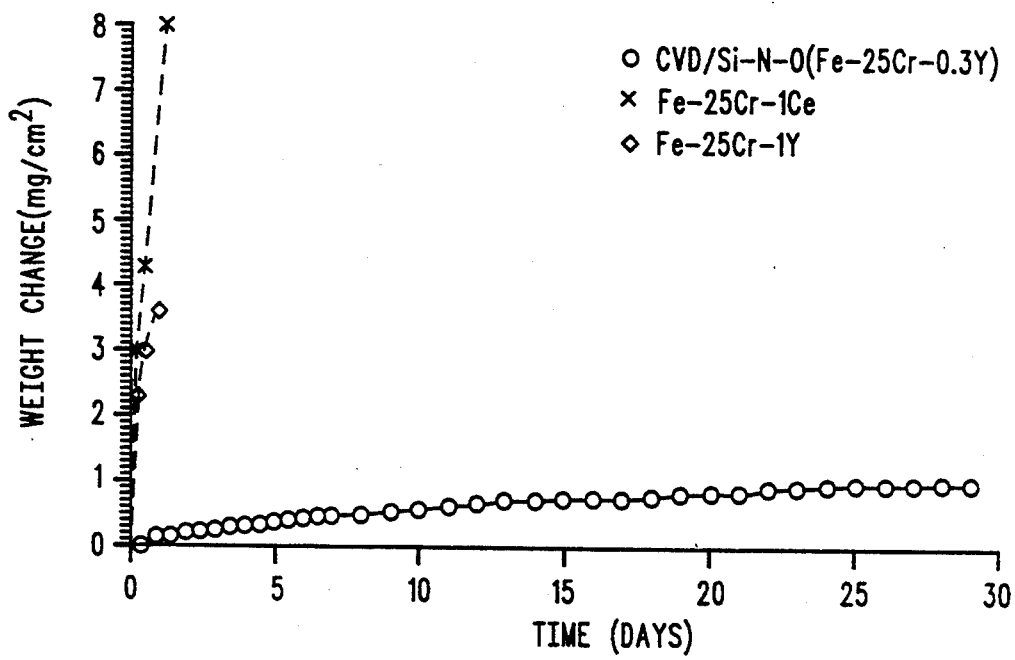
FIG. 4B is a similar plot as FIG. 4A but for a different alloy set oxidized in air at 1000° C. over a 30-day time period.
Figure 4C:
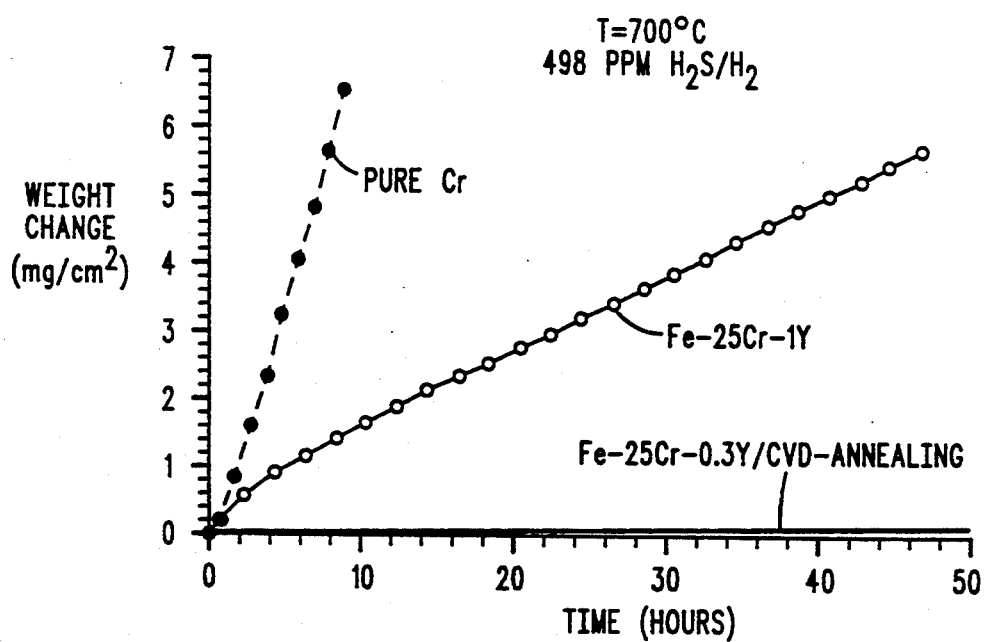
FIG. 4C illustrates weight change arising from corrosion for selected iron based alloys sulfided at 700° C. over a 50-hour time period.
Figure 4D:
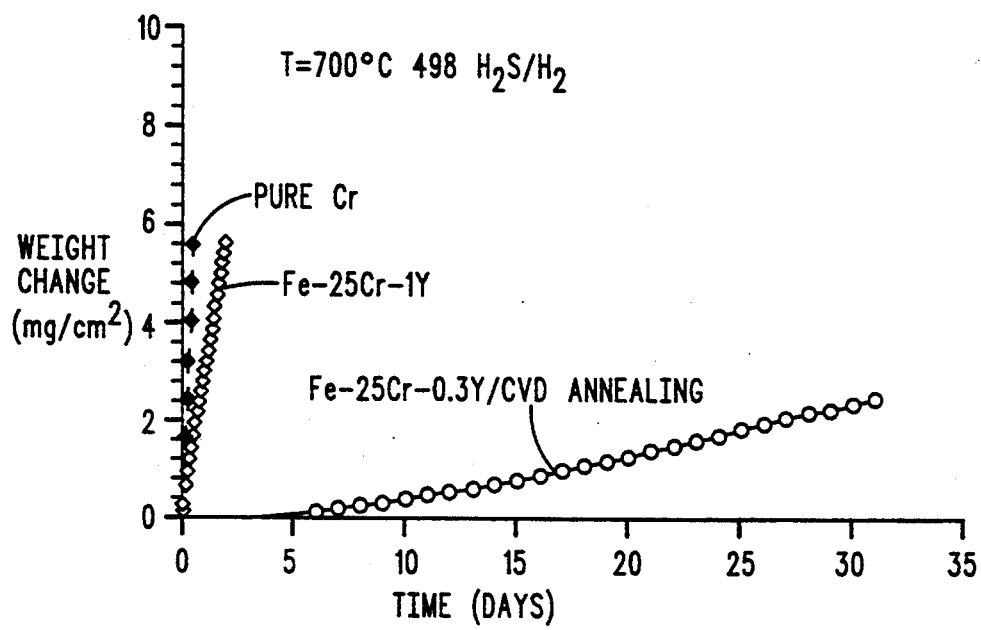
FIG. 4D illustrates the same tests of FIG. 4C but extended to 35 days.
Figure 4E:
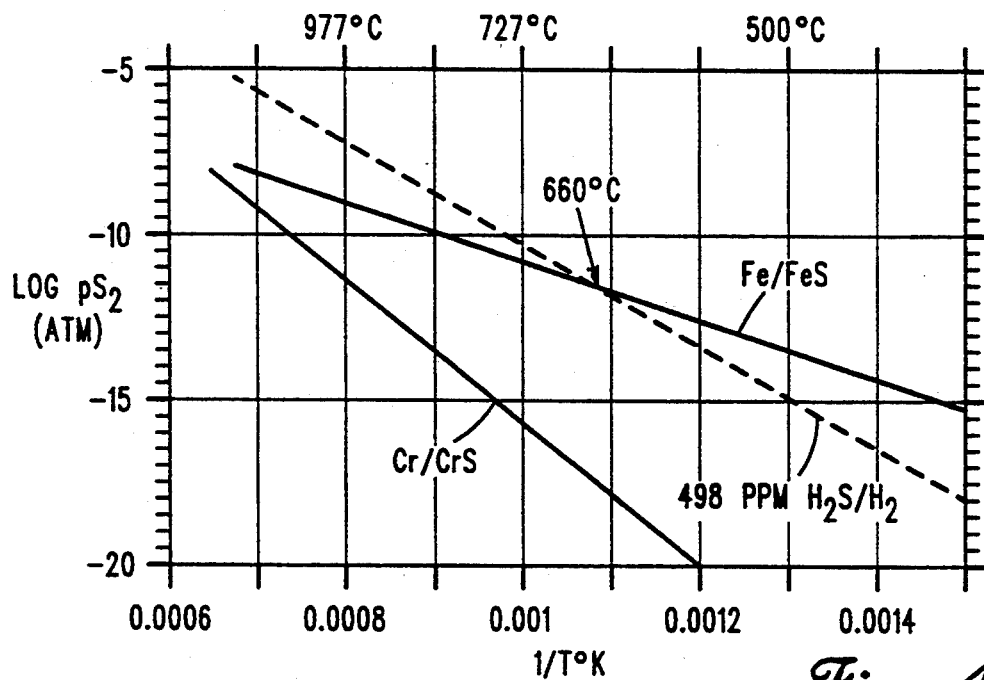
FIG. 4E shows the relationship between log $pS_2$ versus $1/T$ for 498 ppm $H_2S/H_2$, Cr/CrS and Fe/FeS.
Figure 5A:
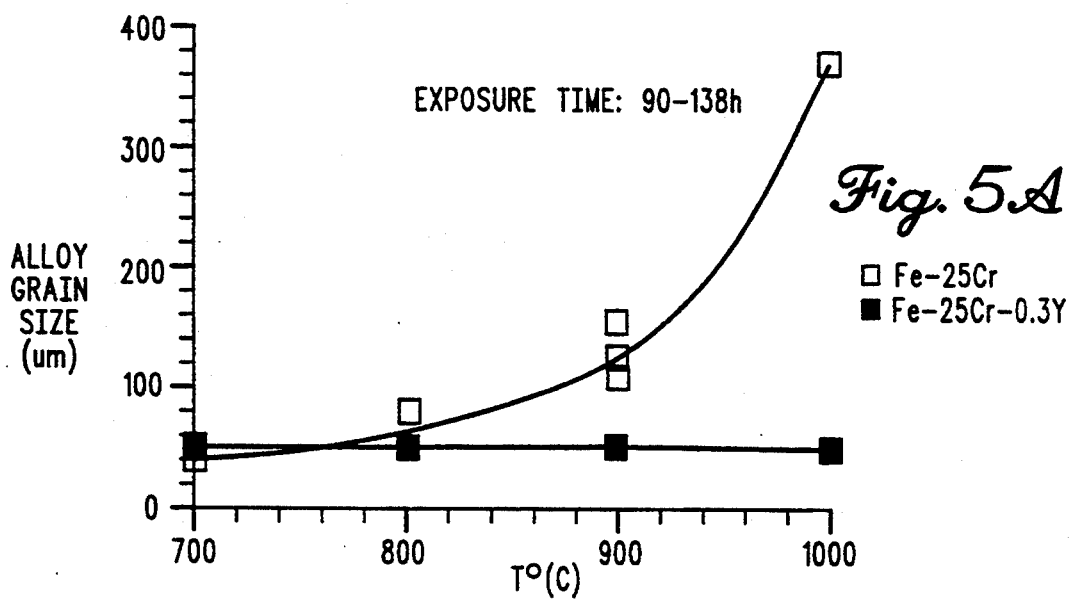
FIG. 5A illustrates grain size variation in iron based alloys during oxidation.
Figure 5B:
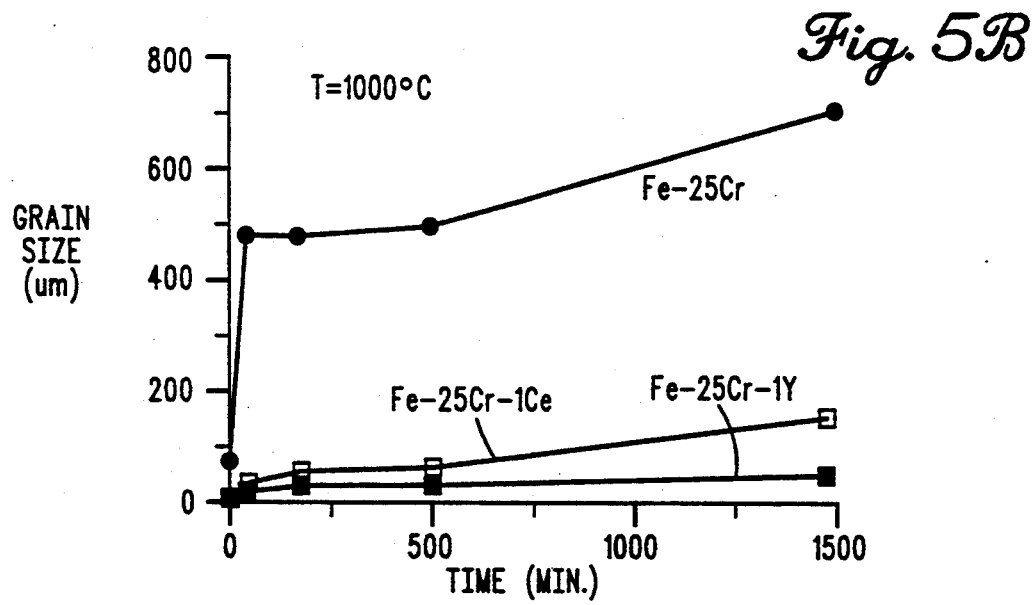
FIG. 5B illustrates a comparison of grain size variation in iron based alloys annealed at 1000° C. over time.

A system 10 for practicing a preferred form of the method of the invention is shown generally in FIG. 3. As shown in FIG. 1 an iron based alloy 12 can undergo corrosion to form an oxide layer 14 which grows by cation diffusion 16 and/or anion diffusion 18 out of, or into, respectively, the iron based alloy 12. In addition to growth and spallation of the oxide layer 14 due to lack of adhesion, the high temperatures of operation (such as, 700°–1000° C.) applied to the iron based alloy 12, can cause enlargement of the size of grains 20 (see FIG. 5A), which also contributes to spallation of the oxide layer 14. This unwanted grain growth can be substantially eliminated by including selected reactive elements, such as Y (0.1–3 wt.%), Ce (0.3–1.0 wt.%), or other such elements like lanthanum as small additions to the iron based alloy 12. Without limiting the scope of any invention which may be claimed herein, it is believed the reactive elements form phases 22 of intermetallic compounds, oxides or stabilized voids at various grain boundary sites as shown in FIG. 2 (the vertically cross hatched phased are, for example, a Fe—Cr—Y phase, the horizontally cross hatched phases are, for example, yttrium oxide and the open circle is a void region). These reactive element containing phases 22 act to stabilize the grain boundaries, prevent any substantial grain growth as can be noted by considering FIG. 5B, and inhibit outward cation diffusion to the surface of the alloy 12.

In order to form an oxide layer 24 (see FIG. 2), which is stable (good adhesion and grows slowly) at high temperatures in a corrosive atmosphere, the system 10 shown in FIG. 3 is used to deposit a silicon containing (preferably a silicide, i.e., a silicon compound) composition on the iron based alloy 12. In a preferred method a chemical vapor deposition source 25 is disposed near iron based alloy samples 26 within a chamber 28 positioned in a furnace 30. In this system 10 the vapor deposition source 25 is heated to cause emission of vapors 32 which can be, for example, a powder mixture of NaF—Si—SiO$_2$, a silane gas source, or other conventional sources which will produce a silicon containing layer on the surface of the alloy samples 26. In a preferred embodiment, the silicide layer can include silicon and oxygen and/or nitrogen and/or chromium. Preferably, the silicon containing layer is roughly 1-2 microns in thickness. The furnace 30 can be used to perform a post anneal and/or to maintain the alloy samples 26 at an elevated temperature (typically, 700°-1200° C.). Such thermal treatments, preferably maintaining elevated temperature during silicide deposition, enable the deposited silicon containing layer to diffuse into the alloy samples 26 and also fill or compensate selected defects, such as dislocations, cracks, voids, atomistic point defects and the like.

In the most preferred embodiment the resulting silicide coated form of the alloy samples 26 were next exposed to an ammonia (NH$_3$) vapor 32 input from ammonia supply 34. Other suitable sources for treating the silicon containing coating can be various nitrogen containing gases, such as NH$_4$OH, NH$_4$ ions or SiN$_2$. The ammonia vapor 32 reacts with the silicon containing coating to form a resulting preferred silicon/oxygen/nitrogen coating 36 on the oxide layer 24 (see FIG. 2). In other forms of the invention, the coating 36 is generally a silicon containing layer having at least a partially amorphous structure. These silicide layers, silicon containing layers, and amorphous silicon containing layers are stable under corrosive atmospheres, such as oxidizing or sulfiding atmospheres, and fill defects, such as cracks, voids and other surface defects. If uncompensated, such defects can act as conduits for cation and/or anion diffusion which act to thicken the oxide layer 24 (or sulfide layer if the alloy 12 is exposed to a corrosive sulfur atmosphere).

Comparison of examples of corrosion protection between iron based alloys with and without the silicon containing protective layer are shown in FIG. 4. Tests were performed in a thermogravimetric microbalance. In FIGS. 4A and 4B are comparisons of iron based alloys oxidized at 1000° C. As can be noted, the alloys coated with the silicon containing layer were much more stable than the unprotected alloys, including even the iron based alloys having reactive element additions of cerium and yttrium. In FIGS. 4C and 4D are shown data from iron based alloys protected with the silicon containing protective layer and exposed to a sulfiding corrosive atmosphere (498 ppm H$_2$S/H$_2$ gas mixture and see FIG. 4E re partial pressure versus 1/T). The protected alloys are again much more stable than the unprotected alloys.

In other forms of the invention a silicon/oxygen/nitrogen and/or chromium layer can be obtained by ion beam deposition of silicon followed by, or preferably accompanied by, introducing ammonia to react with the ion beam deposited silicon to form the silicon and oxygen and/or nitrogen and/or chromium layer. Table I summarizes the resulting properties of ion beam deposited (IBAD) layers and chemical vapor deposition (CVD) layers as measured by X-ray diffraction, Auger spectroscopy, X-ray photoelectron spectroscopy and scanning electron microscopy. This layer is then treated by annealing at high temperatures during deposition to enable diffusion and compensation to take place as described hereinbefore. The resulting layer has good adhesion to the alloy 12 but does not slow down the oxide layer thickening as well as the chemical vapor deposition process. However, the protective layer does provide protection superior to iron based alloys having no protection.

TABLE I

| FE—25Cr—Re (Re = 1 & 0.3 Y and Ce) | | |
|---|---|---|
| IBAD | | |
| | No Heat Treatment | After Heat Treatment | CVD Annealing |
| XRD | Amorphous | Cr$_2$O$_3$ Fe—Cr-Silicides | Cr$_2$O$_3$ Fe—Cr-Silicides |
| Auger | | Si, N, O | |
| XPS | | Si, N, O | |
| SEM | Good Adhesion | Good Adhesion | Good Adhesion |

The following nonlimiting example illustrates various exemplary methods of manufacture of articles.

EXAMPLE

Figure 6:
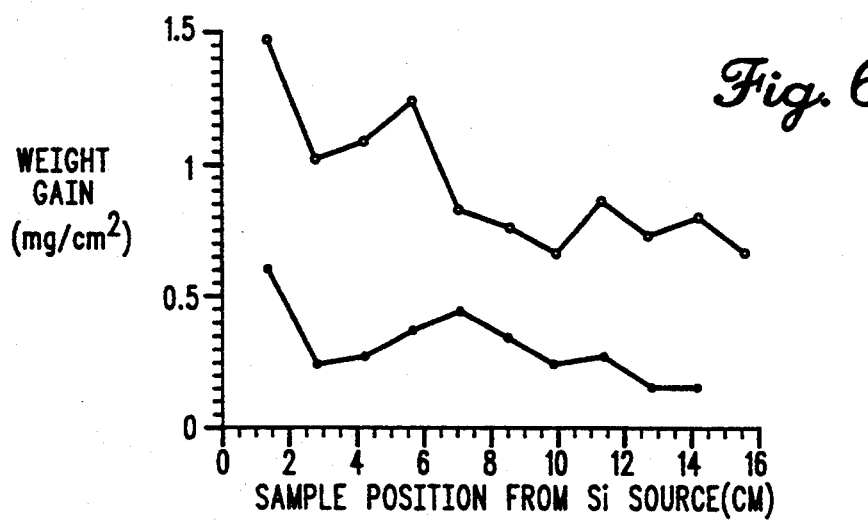
FIG. 6 illustrates sample weight gain for the chemical vapor deposition process for Fe—25Cr—0.3Y and Fe—25Cr—0.3 Ce.
Figure 7A:
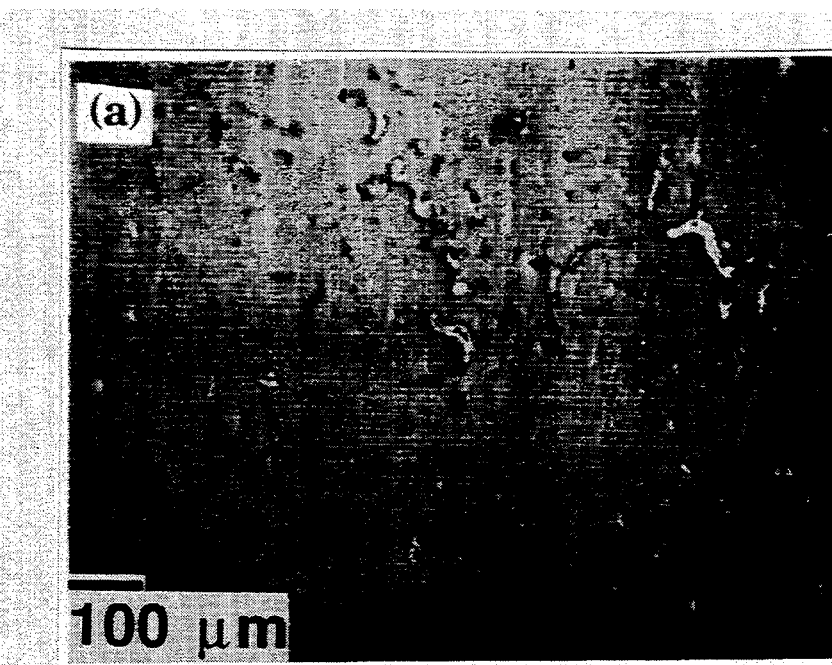
FIG. 7A illustrates a microstructure of an iron based alloy with silicide diffused into the dark gray areas in and around surface defects, fissures and microcracks.
Figure 7B:
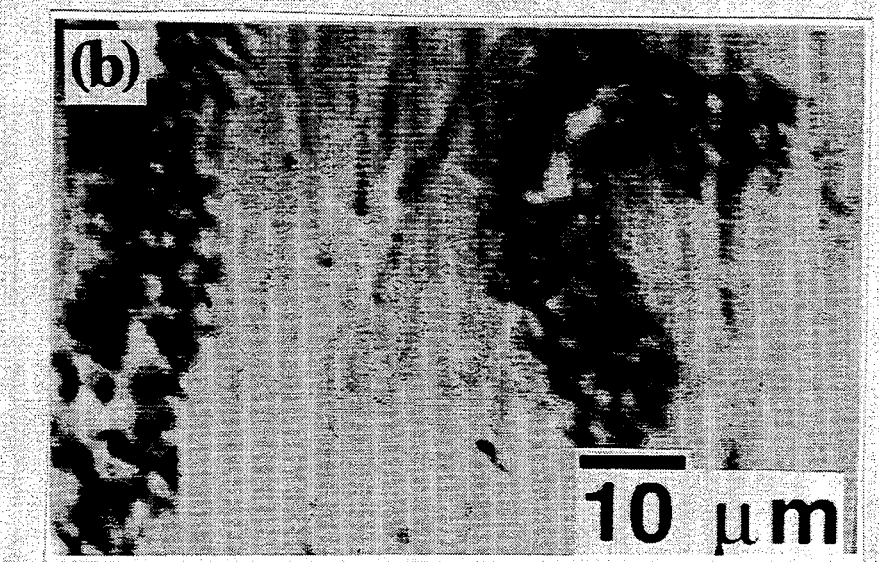
FIG. 7B shows a magnified portion of the right side of the microstructure of FIG. 7A.

A coating of silicon containing material on an iron-chromium alloy was obtained by chemical vapor deposition using a powder mixture of NaF—Si—SiO$_2$. Initially, a 10 gram mixture of NaF—Si—SiO$_2$ was made having a weight ratio of NaF/Si/SiO$_2$=2/1/7. The mixture was ground in a mortar and pestle to refine the powder size. About 2.5 grams of mixed powder was loaded into a high purity alumina boat and then moved into the middle of a quartz chamber (OD-1.5 inch, one end closed and 4 feet long). Coupon samples (0.5 inch ×0.5 inch and 0.05 inches in thickness) of Fe—25-Cr—0.3(Y and/or Ce) were placed into the chamber. A liquid ammonia (NH$_3$) container was attached to the chamber. About ¼ by volume of the chamber was filled with a gas phase of ammonia preceded by filling with high purity Argon gas. The quartz chamber was evacuated with a rotary vacuum pump 50 sitown in FIG. 3. Care was taken not to disturb the powder with slow vacuum pumping at the beginning, and the evacuation process required only several minutes. The furnace was then heated to about 1000° C. over a period of 25 minutes from room temperature. The rotary pump was stopped after 30 minutes heating. About 8 hours later, the ammonia containing chamber was opened slowly and left open for about 2 hours, and the stopcock was closed. The temperature was maintained for several hours, and then the furnace power was turned off. FIG. 6 shows the sample weight gain versus position for the chemical vapor deposition process for Fe—25Cr—0.3Y and Fe—25Cr—0.3Ce. After each run, samples were examined by SEM and by electron energy-dispersive, Auger and X-ray photoelectron spectroscopies. Investigations by SEM, TEM and energy-dispersive spectroscopy, show that the silicon diffused and reacted near the surface of the Fe—25Cr—0.3Y alloy. Silicon has also diffused into and around surface defects, fissures, and micro cracks that are normally the chemically active sites where corrosion begins on the surface of an alloy (see FIG. 7). This sample was polished to remove the silicon containing material from smooth areas of the alloy surface.

While preferred embodiments of the invention have been shown and described, it will be clear to those skilled in the an that various changes and modifications can be made without departing from the invention in its broader aspects as set forth in the claims provided hereinafter.

What is claimed is:

1. A method of preparing a coated iron based alloy, comprising the steps of:
   (a) providing an iron based alloy substrate having a surface;
   (b) depositing a silicon containing layer on said surface using a deposition source mixture of NaF—Si—$SiO_2$ while maintaining said substrate at a temperature of at least about 700° C.; and
   (c) while maintaining said substrate at the temperature of at least about 700° C., exposing said silicon containing layer to an ammonia atmosphere to form said coated iron based alloy.

2. The method as defined in claim 1 wherein said iron based alloy consists essentially of a iron-chromium alloy.

3. The method as defined in claim 2 wherein said iron-chromium alloy further includes a reactive element addition.

4. The method as defined in claim 3 wherein said reactive element addition is selected from the group consisting of yttrium, cerium and lanthanum.

5. The method as defined in claim 1 wherein said step (b) comprises chemical vapor deposition onto said surface.

6. The method as defined in claim 1 wherein a coating is formed on said iron based alloy with said coating selected from the group consisting of a silicon/oxygen/nitrogen compound, a silicon/oxygen/chromium compound, a silicon/nitrogen/chromium compound and an amorphous silicon containing compound.

7. The method as defined in claim 1 wherein said step (b) comprises performing silicon ion beam deposition onto said iron based alloy substrate.

8. The method as defined in claim 7 wherein said step (c) is performed at least in part at the same time as said step (b).

9. A method of preparing a stabilizing protective coating for iron based alloys, comprising the steps of:
   (a) providing an iron based alloy substrate having a surface;
   (b) depositing a silicon and oxygen containing layer on said surface being held at a temperature in the range of about 700° C. to about 1200° C. using a deposition source mixture of NaF—Si—$SiO_2$; and
   (c) exposing said silicon and oxygen containing layer to a nitrogen containing atmosphere to form said stabilizing protective coating.

10. The method as defined in claim 9 wherein said iron based alloy consists essentially of iron-chromium alloy having additions selected from the group consisting of yttrium, cerium and lanthanum.

11. The method as defined in claim 9 wherein said step (b) comprises at least one of chemical vapor deposition and ion beam deposition.

12. The method as defined in claim 9 wherein said step (c) comprises exposing said silicon and oxygen containing layover to ammonia.

13. The method as defined in claim 9 wherein said nitriding atmosphere is selected from the group consisting of $NH_4$, $NH_4OH$, $NH_4$ ions and $SiN_2$ gas.

14. The method as defined in claim 9 wherein said step (b) comprises chemical vapor depositing.

15. The method as defined in claim 9 further including the step of diffusing silicon into said iron based alloy during at least step (b).

16. The method as defined in claim 9 wherein said protective coating is selected from the group consisting of a silicon/oxygen/nitrogen compound, a silicon/oxygen/chromium compound, a silicon/nitrogen/chromium compound and an amorphous silicon containing compound.

17. A method of preparing a coated iron-chromium alloy, comprising the steps of:
   (a) providing an iron chromium alloy having a surface available for coating;
   (b) depositing a silicon/oxygen containing layer on said surface using a deposition source, mixture of NaF—Si—$SiO_2$ while maintaining said alloy at a temperature of about 700°–1200° C. and diffusing silicon into said iron chromium alloy; and
   (c) exposing said silicon/oxygen containing layer to a nitrogen containing atmosphere to form a silicon/oxygen/nitrogen containing coating on said iron-chromium surface.

* * * * *

UNITED STATES PATENT AND TRADEMARK OFFICE
CERTIFICATE OF CORRECTION

PATENT NO. : 5,421,914
DATED : June 6, 1995
INVENTOR(S) : Park, Jong-Hee

It is certified that error appears in the above-identified patent and that said Letters Patent is hereby corrected as shown below:

```
Col. 2, Line 51, cancel "phased" and insert --phases--;
Col. 4, Line 36, cancel "sitown" and insert --shown--;
Col. 4, Line 57, cancel "micro cracks" and insert
--microcracks--;
Col. 4, Line 64, cancel "an" and insert --art--;
Col. 6, Line 15, cancel "layover" and insert --layer--;
Col. 6, Line 35, cancel "," after source.
```

Signed and Sealed this

Twenty-fourth Day of October, 1995

Attest:

BRUCE LEHMAN

*Attesting Officer*    *Commissioner of Patents and Trademarks*